United States Patent [19]
Chung

[11] Patent Number: 6,054,014
[45] Date of Patent: Apr. 25, 2000

[54] EXHAUST APPARATUS

[75] Inventor: Yu-Yun Chung, Hsinchu, Taiwan

[73] Assignee: Vanguard International Semiconductor Corporation, Hsinchu, Taiwan

[21] Appl. No.: 08/859,764

[22] Filed: May 21, 1997

[51] Int. Cl.[7] ................................................... C23F 1/02
[52] U.S. Cl. ...................... 156/345; 118/715; 118/719; 204/298.33
[58] Field of Search ............................ 156/345; 118/715, 118/719; 204/298.33

[56] References Cited

U.S. PATENT DOCUMENTS

| | | | |
|---|---|---|---|
| 5,088,922 | 2/1992 | Kakizaki et al. | 432/152 |
| 5,554,249 | 9/1996 | Hasegawa et al. | 156/345 |
| 5,900,047 | 5/1999 | Rodriguez et al. | 96/243 |
| 5,951,743 | 9/1999 | Hsieh et al. | 95/224 |

*Primary Examiner*—Shrive Beck
*Assistant Examiner*—Norca L. Torres-Velazquez
*Attorney, Agent, or Firm*—Christensen O'Connor Johnson & Kindness PLLC

[57] ABSTRACT

An improved exhaust apparatus for a semiconductor process includes a chamber where the semiconductor process is performed. A load mechanism is used to carry wafers into the process chamber, and a first fan is secured to the load mechanism to carry gas dissipated from the wafers out of the load mechanism. An unload mechanism is used to carry the wafers out of the process chamber, and a second fan is secured to the unload mechanism to carry gas dissipated from the wafers out of the unload mechanism. A chassis is provided to accommodate the load mechanism, the unload mechanism and an electrical/mechanical system. An exhaust opening is located on a side panel of the chassis. An exhaust system is located inside the chassis for carrying the gasses dissipated from the load mechanism and the unload mechanism to the exhaust opening on the chassis. The exhaust system includes a first inlet secured to the first fan, a second inlet secured to the second fan, an outlet secured to the exhaust opening, and an auxiliary inlet through which heat generated from the electrical/mechanical system enters.

21 Claims, 2 Drawing Sheets

EXHAUST APPARATUS

BACKGROUND

1. Field of the Invention

The present invention relates to semiconductor fabrication apparatus and, more particularly, to exhaust systems for semiconductor fabrication apparatus. Still more particularly, the present invention relates to exhaust apparatus used in a semiconductor process for substantially reducing the damage caused by reacted gas from wafers.

2. Background Art

FIG. 1 shows a schematic diagram illustrative of a conventional machine 11 used for performing a semiconductor process. This exemplary machine is used to perform etching processes on semiconductor wafers. The semiconductor processing machine 11 is generally located in a clean room to help maintain a high yield of the process. A cassette of wafers 10 is loaded into an etch chamber 12 by a load mechanism 14. After the wafers are processed in the chamber 12, the wafers are unloaded by an unloaded mechanism 16. The load and unload mechanisms 14 and 16 are housed within a cabinet or chassis 13, along with other structures and units (such as electronic components and an electrical/mechanical system to move the cassette of wafers between the load and unload mechanisms and chamber) of the semiconductor processing machine 11.

While the wafers 10 are in the load mechanism 14 and the unload mechanism 16, gas 18 such as Cl$_2$ and/or HBr typically is dissipated out of the wafers. Therefore, the semiconductor processing machine 11 has a conventional exhaust system to remove the gas 18 from the load and unload mechanisms 14 and 16. More specifically, the load mechanism 14 and the unload mechanism 16 are equipped with fans 17 to move the gas 18 out of the load mechanism 14 and the unload mechanism 16 into the interior of the chassis 13 of the machine 11. The fans 17 thereby cause a relatively high pressure within the chassis 13 relative to the exterior of the chassis. Because of this pressure difference, the gas 18 blown by the fans 17 into the chassis interior flows through an exhaust opening 19 in a side panel of the chassis 13, where the gas 18 is finally collected by an external exhaust treatment system (not shown), such as an exhaust scrubber. In addition, this pressure difference also causes an air flow through the chassis interior that carries the heat generated by the electrical/mechanical system and other electronic components (i.e., waste heat) out the exhaust opening 19.

The inventor of the present invention has observed that in these conventional systems, the interior surface of the chassis 13 and other exposed structures within the chassis interior (e.g., gas lines, printed circuit cards, cables, etc.) located within the chassis can be damaged due to the corrosive nature of the gas 18. More specifically, the gas 18, in moving from the load and unload mechanisms 14 and 16, tend to cause any exposed structures within the chassis 13 to rust or corrode. The operation and reliability of the electrical/mechanical systems (not shown) housed within the chassis 13 are also detrimentally influenced by the gas 18. Moreover, maintenance operators or technicians are likely to be exposed to the gas 18 while performing maintenance duties. In general, exposure to the gas 18 can be hazardous to human health. Still further, if the fans 17 are out of order, a portion of the gas 18 will tend to flow upwards and escape out of the load and unload mechanisms 14 and 16, thereby contaminating the clean room environment. In addition, this escaping gas tends to interfere with the normal air flow 15 in the clean room, resulting in an unacceptable environment for the semiconductor manufacturing process.

SUMMARY OF THE INVENTION

In accordance with the present invention, an improved exhaust apparatus is provided for performing a semiconductor process that substantially decreases the damage made by reacted gas from the wafers. In one embodiment, a processing chamber is provided in which the semiconductor process is performed. A load mechanism is used to carry wafers into the process chamber, and a first fan is attached to the load mechanism to carry gas dissipated from the wafers out of the load mechanism. An unload mechanism is used to carry the wafers out of the process chamber, and a second fan is secured to the unload mechanism to carry gas dissipated from the wafers out of the unload mechanism. A cabinet or chassis is provided to house the load mechanism, the unload mechanism and an electrical/mechanical system. The chassis also has an exhaust opening located on a panel of the chassis.

An exhaust system is located inside the chassis for carrying the gas dissipated from the load mechanism and the unload mechanism to the exhaust opening in the panel of the chassis. The exhaust system includes a first hose having a first opening fitted to the first fan, a second opening fitted to the second fan, and a third opening communicating with the exhaust opening through a connector hose. The connector hose has a one end fitted to the third opening of the first hose. The opposite end of the connector hose is inserted through the exhaust opening. Thus, gas from the load and unload mechanism is isolated from the interior of the chassis while being piped to the exhaust opening. As a result, unlike conventional exhaust systems, the gas from the wafers is prevented from damaging structures within the chassis and from harming maintenance technicians. In addition, the diameter of the connector hose is smaller than the diameter of the exhaust opening so that air from the chassis interior can flow through the exhaust opening.

In another embodiment of the present invention, the exhaust system described above further includes a first T-type connector and three L-type connectors for implementing the first and second openings of the first hose. The first T-type connector has a first opening fitted to the first fan through the first L-type connector, a second opening fitted to the second fan through the second L-type connector, and a third opening fitted to one end of the first hose through a third L-type connector. The exhaust system also include a second T-type connector having a first opening fitted to the second opening of the first hose, a second opening fitted to the exhaust opening in the chassis panel and a third opening exposed to the interior of the chassis through a third L-type connector.

DETAILED DESCRIPTION

Figure 2:
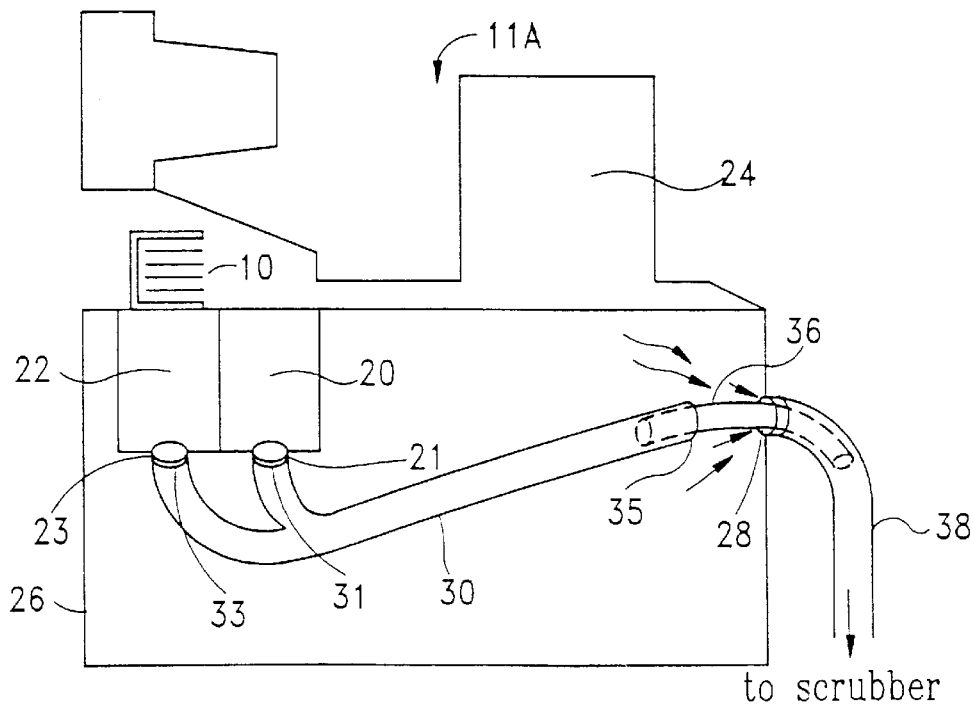
FIG. 2 is a diagram schematically illustrating an exhaust system for a semiconductor processing machine according to one embodiment of the present invention.

FIG. 2 shows a schematic diagram of an exhaust system for a semiconductor processing machine 11A according to one embodiment of the present invention. In this embodiment, the semiconductor processing machine 11A is a model 1-R4420 Rain-bow Poly Machine available from LAM-RESEARCH Corporation, California. Other embodiments of the present invention can be adapted to other semiconductor processing machines such as, for example, machines in the Rain-bow Poly series (e.g., model number 1-R4428, etc.).

Figure 1:
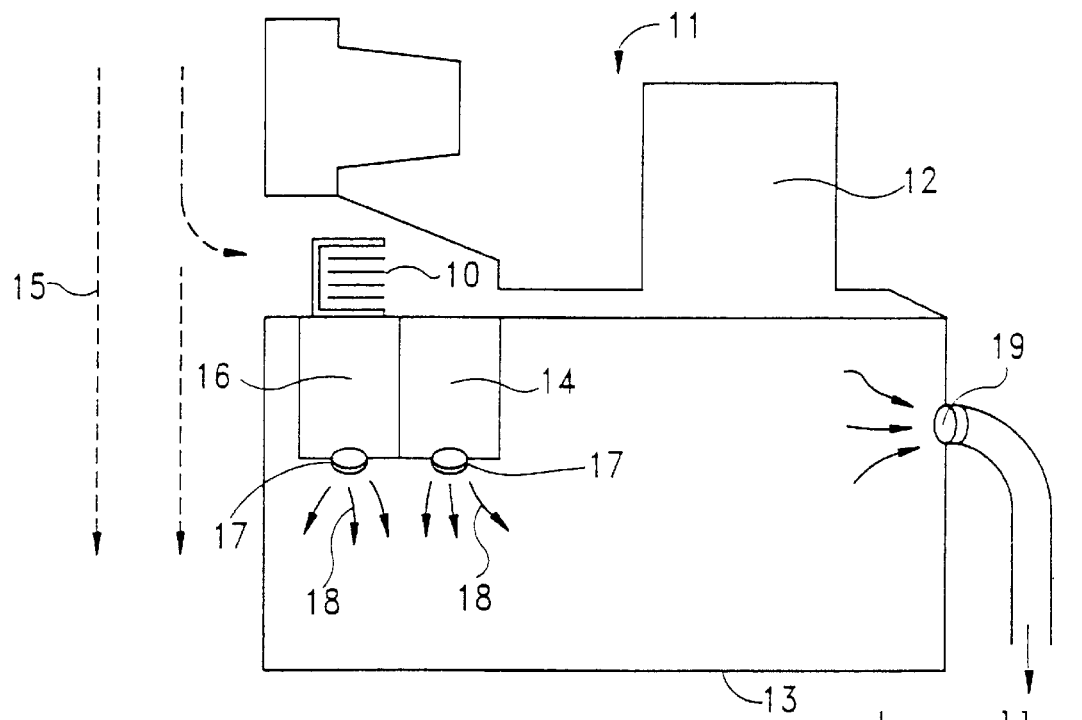
FIG. 1 is a diagram schematically illustrating a machine used for performing a semiconductor process with a conventional exhaust system.
Figure 3:
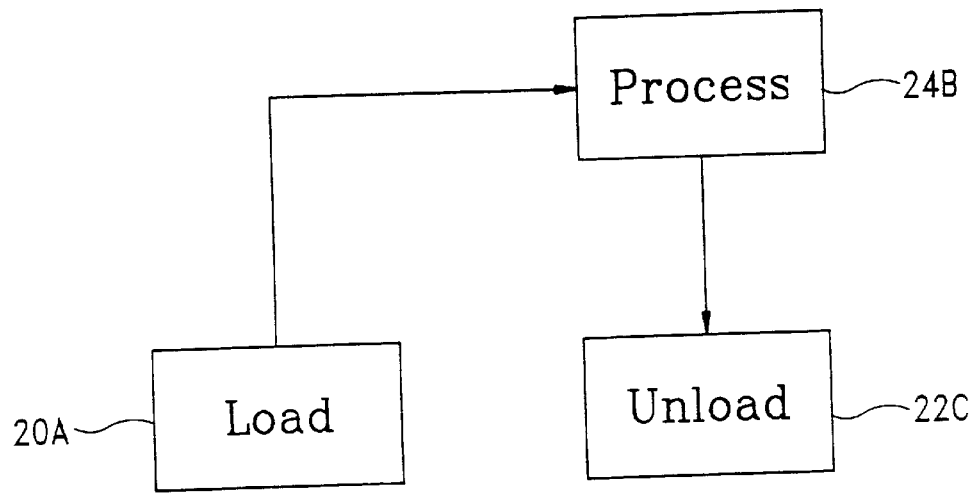
FIG. 3 is a block diagram illustrating the flow of the wafers.

The wafers 10 to be processed are transferred among a load subsystem 20, an unload subsystem 22 and a chamber 24 housed within a chassis 26 of the semiconductor processing machine 11A. In this embodiment, the chamber 24 performs an etch process on the wafers. FIG. 3 shows a block diagram illustrating the flow of the wafers through the semiconductor processing machine 11A during the etch process. Before the etch process begins, the wafers are placed in the load subsystem 20, as indicated by block 20A (FIG. 3). While in the load subsystem 20, gas typically dissipates out of the wafers due to previous process step(s). As described above in conjunction with FIG. 1, this gas is typically a corrosive gas such as $Cl_2$ and/or HBr. This gas is then expelled out of the load subsystem 20 by a fan 21. The wafers 10 are then moved into the chamber 24, in which the etch process is performed as indicated by block 24B (FIG. 3). After the etch process is completed, the wafers are moved into the unload subsystem 22 as indicated by block 22C (FIG. 3). Because of the etch process of block 24B (FIG. 3), more gas, such as $Cl_2$ and/or HBr, is dissipated out of the wafers 10 and into the unload subsystem 22. This gas is expelled out of the unload subsystem 22 by another fan 23.

Inside the chassis 26, a hose 30 is connected to the fans 21 and 23 to receive the gas expelled by the fans 21 and 23. The hose 30 is coupled to an exhaust opening 28 on the side panel of the chassis 26 via a second hose 36. More specifically, the hose 30 has a first opening or end 31 fitted to the fan 21 so that the fan 21 blows into the hose 30. The hose 30 also has a second opening or end 33 fitted to the fan 23 so that the fan 23 blows into the hose 30. The hose 30 has a third opening or end 35 that is tightly fitted and secured to one end of the other hose 36 so that gas can move between the hose 30 and the hose 36 with substantially no leakage. In this embodiment, the hose 36 as a second end that is loosely inserted into the exhaust opening 28 so that air from the interior of the chassis 26 can flow around the hose 36 and through the exhaust opening 28. The exhaust opening 28 is further connected via a pipe 38 to an exhaust treatment system (not shown) such as a scrubber.

Because of the configuration of the exhaust system of the present invention, the gas from the load subsystem 20 and the unload subsystem 22 flows through the two hoses 30 and 36 to the exhaust opening 28. Consequently, the interior of the chassis 26 is not exposed to this gas. As a result, corrosion of the interior surface and structures of the chassis is substantially eliminated, thereby increasing the life of the machine 11A. In addition, the gas is prevented from interfering with the operation of the machine 11A, and machine operators are not exposed to the gas. Furthermore, heat generated from the electrical/mechanical system and other electronic components housed inside the chassis 26 is carried away by the air flow within the chassis 26 through a portion of the exhaust opening 28 not completely occupied by the hose 36. In this embodiment, the diameter of the exhaust opening 28 is about 4 inches, the diameter of the hose 36 is about 2 inches, and the diameter of the hose 30 is about 3 inches. The hoses 30 and 36 are made of thermoplastics such as polyvinyl chloride (PVC) or polypropylene (PP), although any suitable material may be used.

Figure 4:
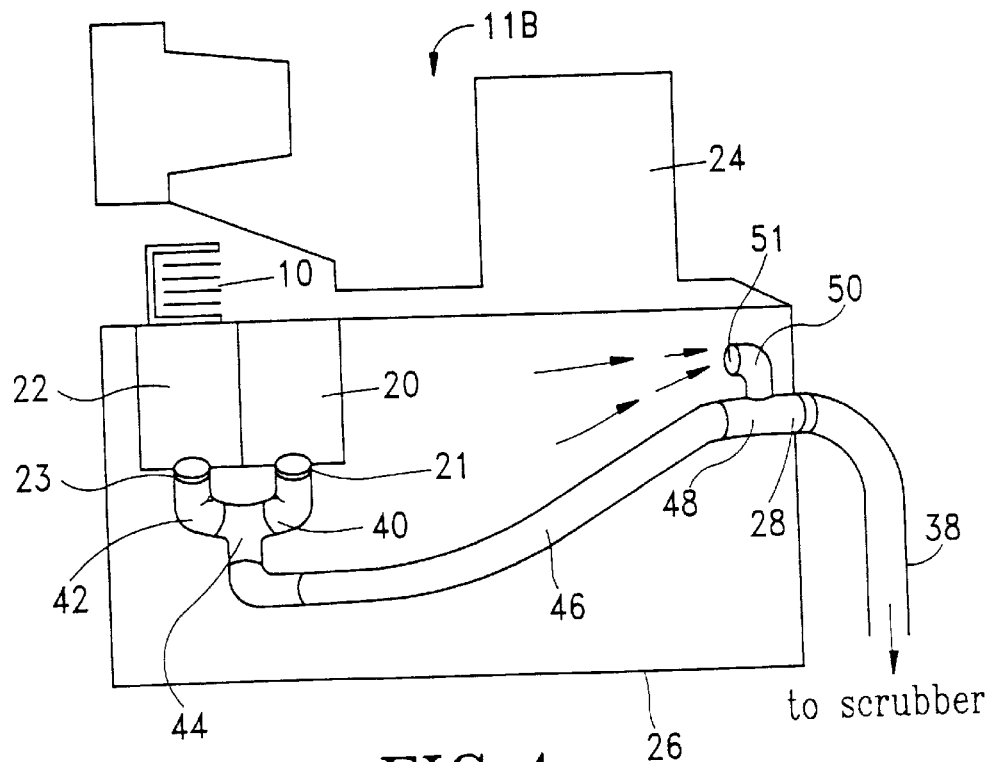
FIG. 4 is a diagram schematically illustrating an exhaust system for a semiconductor processing machine according to another embodiment of the present invention.

FIG. 4 shows a schematic diagram illustrative of a semiconductor processing machine 11B according to another embodiment of the present invention. The same reference numerals as used in FIG. 2 are used in FIG. 4 to indicate elements having substantially identical structure and function. As shown in FIG. 4, the machine 11B is substantially identical to the machine 11A (FIG. 2) except for the hose network used to control the flow of the gas within the chassis 26. In this embodiment, one end of a first L-type connector 40 is fitted to the fan 21 of the load subsystem 20. Similarly, one end of a second L-type connector 42 is fitted to the fan 23 of the unload subsystem 22. The other ends of the two L-type connectors 40 and 42 are fitted to two of the ends of a T-type connector 44. The third end of the T-type connector 44 is fitted to one end of a hose 46. The hose 46 has an opposite end that is fitted to one end of another T-type connector 48. A second end of the T-type connector 48 is fitted to the exhaust opening 28 of the chassis 26. The T-type connector 48 has a third end that is fitted to one end of a third L-type connector 50, whose another end 51 opens to the interior of the chassis 26. The end 51 is used to receive air flowing from the interior of the chassis 26.

The pressure within the pipe 38 coupling the exhaust port 28 to the scrubber is kept lower than the pressure within the hose 46 and the interior of the chassis 26. As a result of this pressure difference, the gas from the load and unload subsystems 20 and 22 flows from the hose 46 through the pipe 38 and to the external exhaust treatment system. In addition, this pressure difference causes air to flow within the chassis 26, through the end 51 of the L-type connector 50, through the T-type connector 48 and then to the pipe 38, thereby carrying away heat generated by the electronic components and electrical/mechanical system (not shown) inside the chassis 26. In this embodiment, the diameter of the hose 46 is about 3 inches, and the diameter of the exhaust opening 28 is about 4 inches. The hose 46 is made of thermoplastics such as PVC or PP.

Although specific embodiments including the preferred embodiment have been illustrated and described, it will be appreciated by those skilled in the art that various modifications may be made without departing from the spirit and scope of the present invention, which is intended to be limited solely by the appended claims.

What is claimed is:

1. Exhaust apparatus for use in a machine that performs a semiconductor process on a wafer, the machine having a chassis, a chamber, a load mechanism and an unload mechanism, the load and unload mechanisms each having an opening coupled to an interior of the chassis, said exhaust apparatus comprising:

(a) a first fan, fitted to the opening of the load mechanism (b) a second fan, fitted to the opening of the unload mechanism (c) a body portion having an interior passageway configured to conduct gas;

(d) a first end coupled between said body portion and the first fan, said first end configured to allow gas to flow from said load mechanism into said interior passageway of said body portion without flowing into the interior of the chassis;

(e) a second end coupled between said body portion and the second fan, said second end configured to allow gas to flow from said unload mechanism into said interior passageway of said body portion without flowing into the interior of the chassis; and (f) a third end coupled between said body portion and an opening in the chassis, said third end configured to allow gas from said interior passageway of said body portion to flow through said opening in the chassis, said third end further configured to allow air from the interior of the chassis to flow through said opening in the chassis, wherein gas from the load mechanism is isolated from the interior of the chassis and gas from the unload mechanism is isolated from the interior of the chassis.

2. The apparatus according to claim 1, wherein the apparatus is adapted to carry a gas comprising $Cl_2$.

3. The apparatus according to claim 1, wherein the apparatus is adapted to carry a gas comprising HBr.

4. The apparatus according to claim 1, wherein the apparatus is adapted to carry a gas comprising $Cl_2$, and HBr.

5. The apparatus according to claim 1, wherein said body portion, said first end, and said second end are implemented with a hose having a first opening, a second opening and a third opening, said first opening of said first hose being fitted to said opening of said load mechanism, and said second opening of said first hose being fitted to said opening of said unload mechanism.

6. The apparatus according to claim 5, wherein said third end comprises a second hose having a first opening and a second opening, said second hose extending from the interior of the chassis through the opening in the chassis, said first opening of said second hose being connected to said third opening of first hose, and said second opening of said second hose being located external to the chassis.

7. The apparatus according to claim 6, wherein said second hose has an external dimension that is sized to allow air to flow around the second hose and through the opening in the chassis.

8. The apparatus according to claim 6, wherein said first hose and said second hose comprise polyvinyl chloride.

9. The apparatus according to claim 6, wherein said first hose and said second hose comprise polypropylene.

10. The apparatus according to claim 1, wherein said first end of said apparatus comprises a first L-type connector having:
   (a) a first opening fitted to said opening of the load mechanism; and
   (b) a second opening.

11. The apparatus according to claim 10, wherein said second end of said apparatus comprises a second L-type connector having:
   (a) a first opening fitted to said opening of the unload mechanism; and
   (b) a second opening.

12. The apparatus according to claim 11, wherein said body portion comprises:
   (a) a hose having a first opening and a second opening; and
   (b) a first T-type connector having:
      (1) a first opening fitted to said second opening of said first L-type connector,
      (2) a second opening fitted to said second opening of said second L-type connector, and
      (3) a third opening fitted to said first opening of said hose.

13. The apparatus of claim 12 wherein said third end of said apparatus comprises:
   (a) a third L-shaped connector having a first opening located within the interior of the chassis and having a second opening; and
   (b) a second T-shaped connector having:
      (1) a first opening fitted to said second opening of said hose,
      (2) a second opening fitted to the opening of the chassis, and
      (3) a third opening fitted to said second opening of said third L-shaped connector.

14. The apparatus according to claim 12, wherein said hose comprises a thermoplastic.

15. The apparatus according to claim 14, wherein said thermoplastic comprises polyvinyl chloride.

16. The apparatus according to claim 14, wherein said thermoplastic comprises polypropylene.

17. Exhaust apparatus, comprising:
   (a) a chamber configured to have a semiconductor process performed therein;
   (b) load means for carrying a plurality of wafers into said chamber, said load means having a first fan configured to move gas dissipated from the plurality of the wafers out of said load means;
   (c) unload means for carrying the plurality of wafers out of said chamber after the semiconductor process is performed, said unload means having a second fan configured to move gas dissipated from the plurality of wafers out of said unload means;
   (d) a chassis having a panel, said panel having an exhaust opening, wherein said panel partially defines an interior of said chassis; and
   (e) exhaust means, located in said interior of said chassis, for allowing air to flow from said interior of said chassis to said exhaust opening and for carrying to said exhaust opening the gas moved out of said load means and the gas moved out of said unload means without said gases flowing into said interior of said chassis.

18. The apparatus according to claim 17, wherein said exhaust means comprises:
   (a) a first hose having:
      (1) a first end fitted to the first fan,
      (2) a second end fitted to the second fan, and
      (3) a third end; and
   (b) a second hose having:
      (1) a fourth end fitted to the third end, and
      (2) a fifth end inserted through the exhaust opening, wherein an external diameter of the fifth end is less than a diameter of the exhaust opening.

19. The apparatus according to claim 17, wherein said chamber comprises an etch chamber.

20. The apparatus according to claim 17, wherein said exhaust means comprises:
   (a) a first T-type connector having:
      (1) a first end coupled to carry gas moved by the first fan,
      (2) a second end coupled to carry gas moved by the second fan, and
      (3) a third end;
   (b) a hose having:
      (1) a fourth end fitted to the third end, and
      (2) a fifth end;
   (c) a second T-type connector having:
      (1) a sixth end fitted to the fifth end,
      (2) a seventh end fitted to the exhaust opening, and
      (3) an eighth end; and
   (d) a first L-type connector fitted to the eighth end.

21. The apparatus according to claim 20, further comprising:
   (a) a second L-type connector coupling the first fan to the first end; and
   (b) a third L-type connector coupling the second fan to the second end.

* * * * *